United States Patent
Fleizach et al.

(10) Patent No.: US 10,060,961 B1
(45) Date of Patent: Aug. 28, 2018

(54) SPECTROGRAM COMPRESSION FOR DATA TRANSMISSION

(71) Applicants: Greg K Fleizach, San Diego, CA (US); Bruce I Incze, Portsmouth, RI (US); Andrew M Mara, Saunderstown, RI (US)

(72) Inventors: Greg K Fleizach, San Diego, CA (US); Bruce I Incze, Portsmouth, RI (US); Andrew M Mara, Saunderstown, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 319 days.

(21) Appl. No.: 14/958,036

(22) Filed: Dec. 3, 2015

(51) Int. Cl.
  *G01H 17/00* (2006.01)
  *G01R 29/08* (2006.01)

(52) U.S. Cl.
  CPC ......... *G01R 29/0892* (2013.01); *G01H 17/00* (2013.01)

(58) Field of Classification Search
  CPC ...... G01R 29/0892; G01H 17/00; G01H 3/08; G06F 17/30743; G01L 21/04
  See application file for complete search history.

(56) References Cited

PUBLICATIONS

Ptak et al., Long-Distance Multistatic Aircraft Tracking with VHF Frequency Doppler Effect, Jul. 2014, IEEE Transactions on Aerospace and Electronic Systems, vol. 50, No. 3, pp. 2242-2252.*

* cited by examiner

*Primary Examiner* — Toan Le
(74) *Attorney, Agent, or Firm* — James M. Kasischke; Michael P. Stanley

(57) ABSTRACT

A method for data compression and transmission includes receiving sensor data which is digitized and transformed into a spectrogram. The spectrogram is filtered and converted into a binary representation. A Hough transform is used to find lines in the representation. Related lines are combined, and then converted back into time frequency space. Lines are optimized and composed into a binary message. The binary message can be transmitted and received at a remote location. A reconstructed spectrogram can be created at the remote location from the lines. In other embodiments, parameters such as power, stability, width, and wander can be calculated and transmitted. The reconstructed spectrogram can be displayed along with the parameters.

12 Claims, 4 Drawing Sheets

| 1 | 5 | 6 | 4 | 3 | 10 | 5 | 6 | 7 | 3 |
|---|---|---|---|---|----|---|---|---|---|
| 5 | 2 | 8 | 1 | 4 | 9  | 8 | 8 | 7 | 3 |
| 8 | 5 | 9 | 1 | 6 | 8  | 7 | 1 | 7 | 5 |
| 9 | 5 | 0 | 2 | 4 | 10 | 8 | 6 | 5 | 8 |
| 4 | 8 | 3 | 7 | 6 | 10 | 9 | 5 | 6 | 5 |
| 3 | 7 | 7 | 9 | 4 | 8  | 5 | 4 | 3 | 6 |
| 7 | 3 | 6 | 8 | 7 | 6  | 2 | 9 | 2 | 7 |
| 5 | 0 | 7 | 6 | 3 | 3  | 1 | 6 | 2 | 9 |

FREQUENCY

FIG. 4A

| 0 | 0 | 1 | 0 | 0 | 1 | 0 | 0 | 0 | 0 |
|---|---|---|---|---|---|---|---|---|---|
| 0 | 0 | 1 | 0 | 0 | 1 | 0 | 0 | 0 | 0 |
| 0 | 0 | 1 | 0 | 0 | 1 | 0 | 0 | 0 | 0 |
| 1 | 0 | 0 | 0 | 0 | 1 | 0 | 0 | 0 | 0 |
| 0 | 1 | 0 | 0 | 0 | 1 | 0 | 0 | 0 | 0 |
| 0 | 0 | 0 | 1 | 0 | 1 | 0 | 0 | 0 | 0 |
| 0 | 0 | 0 | 1 | 0 | 0 | 0 | 1 | 0 | 0 |
| 0 | 0 | 1 | 0 | 0 | 0 | 0 | 0 | 0 | 1 |

FREQUENCY

FIG. 4B

SPECTROGRAM COMPRESSION FOR DATA TRANSMISSION

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

None.

BACKGROUND OF THE INVENTION

(1) Field of the Invention

The present invention relates to a data compression method for transmitting spectrograms and more particularly relates to a robust method for transmitting such data at a low bandwidth.

(2) Description of the Prior Art

It is often useful in radio frequency (RF) or acoustic applications to view or process the frequency content in real time. This is accomplished by creating a spectrogram, which involves performing discrete Fourier transforms (DFTs) over small time slices. A small time slice means a time increment short in duration. For this reason, spectrograms are sometimes called short time Fourier transforms (STFTs). The length of the time slice is chosen based on the required frequency resolution. The slices are sometimes overlapped in time to mitigate loss if windowing is used. The frequency information in the time slice is then stacked upon the frequency information from previous time slices to create a matrix where one axis represents frequency and the other axis represents time. The magnitude squared of the frequency values are computed to show power content and then converted from natural numbers to decibels. The result can be viewed in an image where the power is denoted by pixel intensity or color with time on one axis and frequency on the other.

Spectrograms can be used to detect or classify signals of interest. Signals that are tough to pick out in a time series view, such as continuous wave (CW) tones or linear frequency modulation (LMF), can be quite clear in a spectrogram. After spectrogram generation, it is possible to use thresholding, edge detection, or other techniques to extract the information of interest from the data.

In many applications, remote sensors are used to listen for signals, whether RF or acoustic, because it is impractical for an attended sensor to be used. This can be the case when the sensor must be placed in locations of limited accessibility. This could involve sensors placed in the wilderness, along a remote boundary, in the ocean, in space or the like.

Sensor retrieval, however, can be extremely difficult if the sensor was placed in a location of limited accessibility or if it was submerged. In these cases, the sensors may be considered expendable, but the data must be wirelessly transmitted from the sensors. Whether the sensor communicates to a cell tower, satellite, airplane, etc, it is desired to minimize transmission time. For some sensors, an airplane or helicopter is required to activate transmission from the sensor and maintain a link while the data is transmitted. This is obviously an expensive solution and the less time required the better. Transmission is also power-intensive and can be the most difficult aspect of the power budget of remote sensors. Thus, minimizing transmission time saves sensor battery, providing a longer operational life. A shorter transmission time also avoids needlessly occupying the communications link when the link is bandwidth limited.

Many applications, however, transmit the raw time series data or spectrogram over the link. This is often wasteful since there is extraneous information in the raw data, but the signal processing required to pull salient information may be too computationally intensive for a power conscious remote sensor.

Another solution that is commonly used to address the magnitude of data that must be transmitted is to use standard data compression techniques. These techniques try to shrink the data, but without any knowledge of the signals of interest, they invariably result in suboptimal compression or cause the loss of important information. Further, the user receiving the data may be unaware that any data is missing.

In view of these considerations, what is needed is a data compression method specifically tailored to compression of spectrographic data. The method should greatly compress the data while retaining parameters of interest.

SUMMARY OF THE INVENTION

Accordingly, it is an object of the present invention to provide a method for compressing spectrum data from a sensor;

It is another object of the present invention to provide such a compression method when the signals of interest are frequency modulated and continuous wave signals.

Accordingly, there is provided a method for data compression and transmission that includes receiving sensor data which is digitized and transformed into a spectrogram. The spectrogram is filtered and converted into a binary representation. A Hough transform is used to find lines in the representation. Related lines are combined, and then converted back into time frequency space. Lines are optimized and composed into a binary message. The binary message can be transmitted and received at a remote location. A reconstructed spectrogram can be created at the remote location from the lines. In other embodiments, parameters such as power, stability, width, and wander can be calculated and transmitted. The reconstructed spectrogram can be displayed along with the parameters.

BRIEF DESCRIPTION OF THE DRAWINGS

The above and other objects and advantages of the present invention will become apparent from the following description, drawings and claims wherein:

FIG. 4A is a diagram illustrating multiple spectrum levels in accordance with the current method;

FIG. 4B is a diagram showing binarization of the spectrum of FIG. 4A;

DETAILED DESCRIPTION OF THE INVENTION

Figure 1:
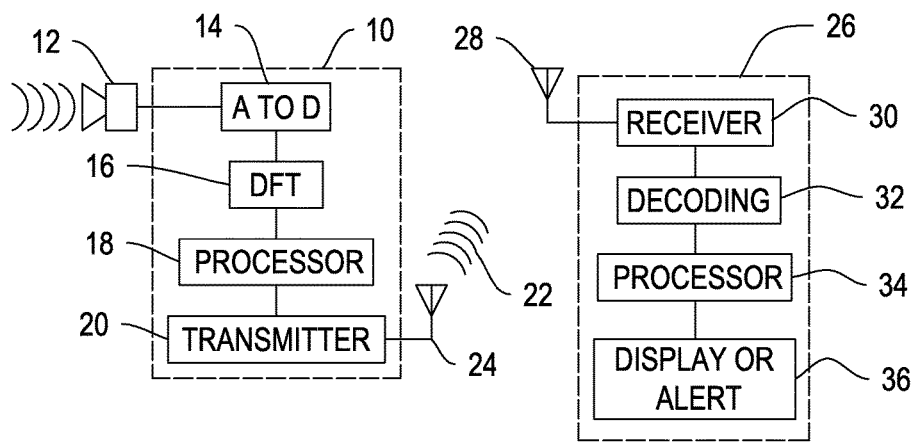
FIG. 1 is a diagram of one system utilizing the current method.

FIG. 1 is a diagram of an exemplary system in which the method could be embodied. A remote sensor module 10 has a sensor 12 for receiving environmental signals. Sensor 12 can be any known sensor such as an electromagnetic sensor, an acoustic sensor or a vibration sensor. Sensor 12 is coupled to an analog to digital converter 14 to transform the analog signal from sensor 12 into a digital signal of the appropriate bandwidth. Analog to digital converter 14 is joined to a discrete Fourier transformer 16 for transformation from a time domain digital signal into a frequency domain signal.

The frequency domain signal is provided to a processor 18 for processing and compression in accordance with the current method. Processor 18 is joined to transmitter 20 to make the processed signal available for transmission. Processor 18 can also add an identifier indicating the specific remote sensor module 10 for situations involving multiple remote sensor modules 10. Either processor 18 or transmitter 20 can encode the signal for transmission. This encoding can be in any known form suitable for a digital transmission including pulse code modulation, pulse modulation, frequency shift keying, phase shift keying, amplitude shift keying, quadrature amplitude modulation or the any other such method or combination thereof. Signal 22 is transmitted by an emitter 24. Transmission can be electrical, optical or acoustic and may be through a path such as a wire or fiber or wirelessly.

A receiving module 26 has a receptor 28 for receiving signal 22 and providing it to receiver 30. The signal from receiver 30 is decoded by a decoder 32 to remove modulation characteristics. Decoder 32 can be joined to provide the decoded signal to receive processor 34 and/or a display or alertment device 36. Processor 34 can act on the decoded signal by providing it to another system for further actions. Display or alertment device 36 can indicate signal parameters and warning indications if a specific type of signal is received. Display can be any kind of display known in the art, and alertment device can be a warning light or audio warning or the like. Both processor 34 and display or alertment device 36 can be capable of decoding identifier in signal to indicate signal origin. Of course other systems, including manned systems, could utilize the teachings herein. The method should not be limited to use with a system such as that depicted in FIG. 1.

The method of this invention is specifically adapted to compress the spectrogram of the digital signal. This compression is achieved by approximating the spectrogram as a collection of lines. This is a reasonable assumption when the signals of interest contained in the spectrogram are continuous wave (CW) tones or linear frequency modulated signals. Each line is assumed to last for the duration of the spectrogram window. By breaking a spectrogram into windows representing a short enough duration for the specific application, an arbitrarily complicated frequency modulated (FM) signal can be compressed. Overlapping windows can also be used if necessary to obtain important signal characteristics.

Figure 2:
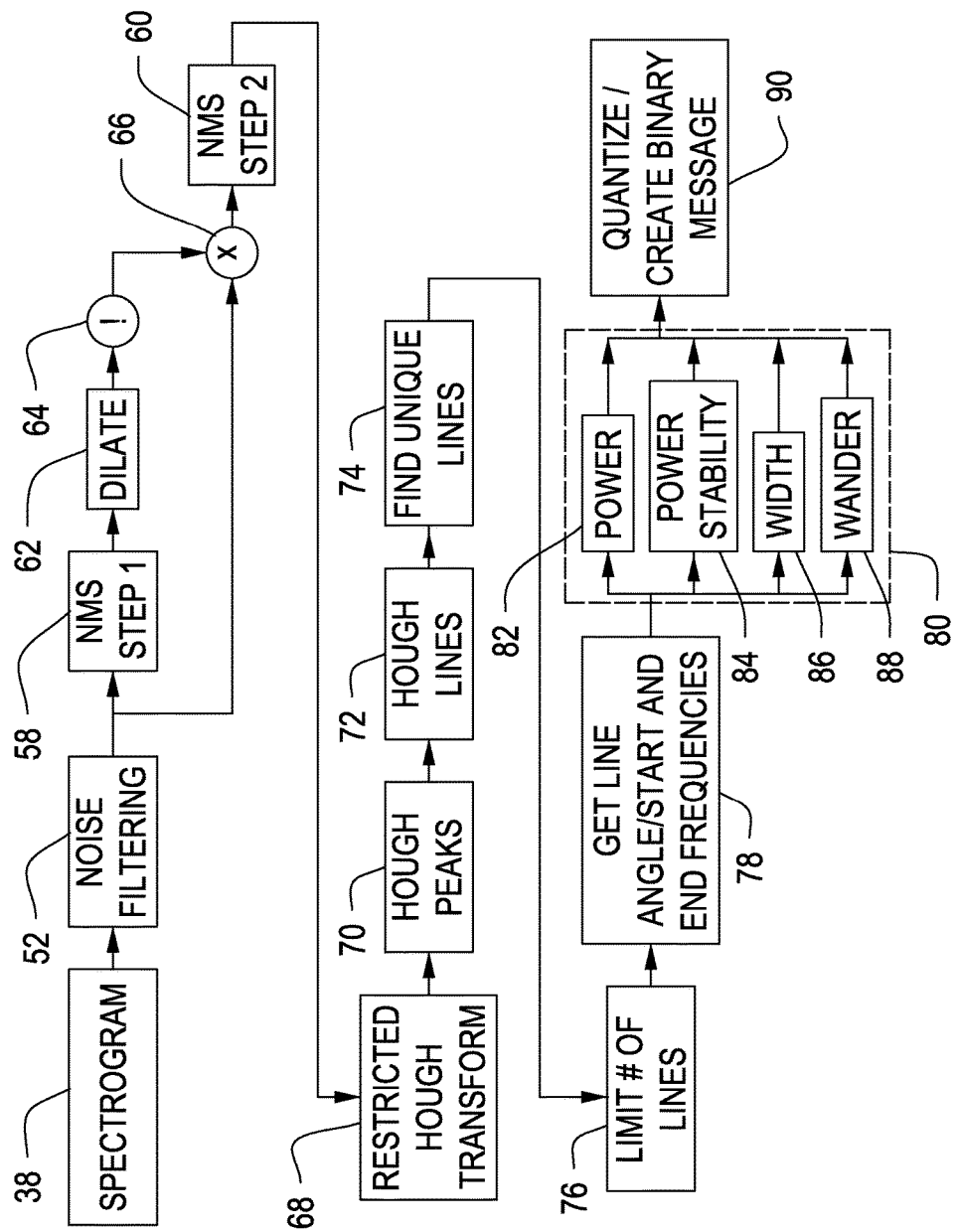
FIG. 2 is a flow diagram of the current method.

A flow diagram is shown in FIG. 2. This method is applicable to a plurality of different source signals including acoustic signals, seismic signals, and radio frequency signals. Once the signal has been received at the sensor and has been digitized in analog to digital converter 14, it can be processed according to the following method. A spectrogram is built in step 38 using the discrete Fourier transformer 16 on segments of the time series data. The discrete Fourier transform (DFT) is typically implemented with a fast Fourier transform (FFT); however, other algorithms and transforms could be used. The length of the segments in time depends on the desired FFT resolution where the resolution will be:

$$f_{res} = \frac{1}{T} \tag{1}$$

where $f_{res}$ is the frequency resolution in Hz, and T is the length of the segment in seconds. The number of time segments to use in building the compressible spectrogram depends on the signals of interest.

Figure 3:
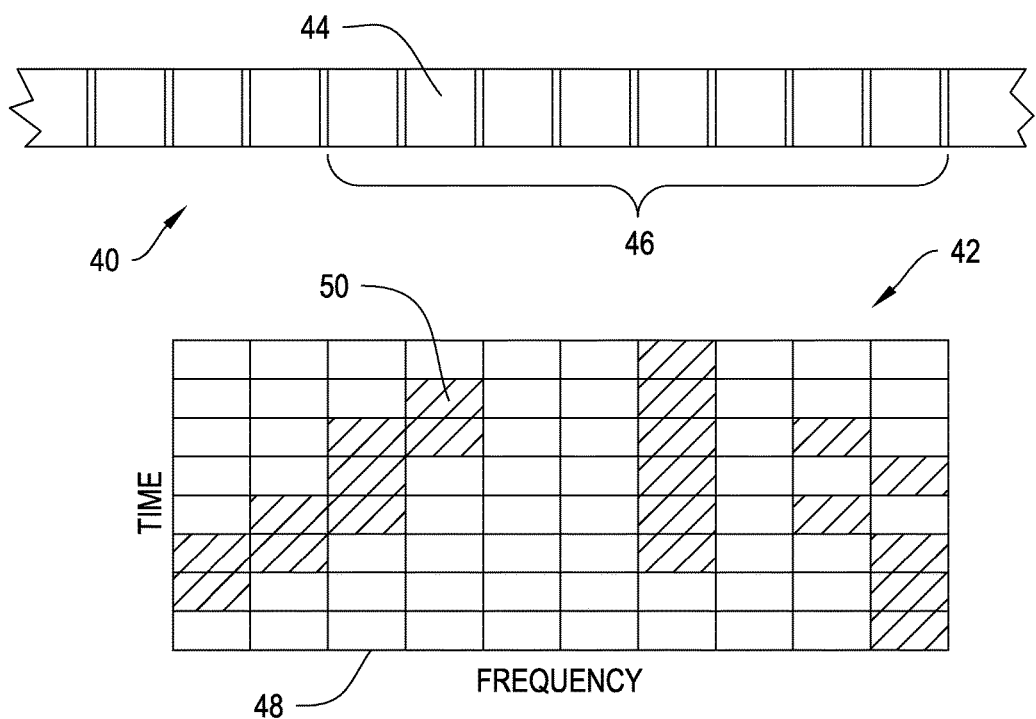
FIG. 3 is a diagram illustrating the creation of a spectrum from a data stream.

Stable signals can use longer time segments while more dynamic signals require shorter duration spectrograms, which must then be transmitted more frequently. In general, the larger the time segments, the higher the resulting compression. The magnitude squared of the frequency results output from the DFT are calculated to yield power estimates. For viewing, the power is typically converted to decibels, but for compression it will be kept in natural numbers. FIG. 3 gives an example of transforming time domain data 40 into a spectrogram 42. Time domain data 40 includes a plurality of time segments 44. A number 46 of time segments 44 are provided to discrete Fourier transform 16. Transform 16 produces spectrogram 42. Spectrogram 42 provides signal frequencies grouped into frequency bins 48, shown as the columns of spectrogram 42, versus time, shown as the rows. Shaded pixels, such as pixel 50, show the presence of a signal in that frequency bin at the specific time.

After producing the spectrogram in step 38, the spectrogram is filtered in step 52 to remove noise. In the example of FIG. 3, a 3×3 Gaussian filter of the form:

$$F = \begin{vmatrix} \frac{1}{16} & \frac{2}{16} & \frac{1}{16} \\ \frac{2}{16} & \frac{4}{16} & \frac{2}{16} \\ \frac{1}{16} & \frac{2}{16} & \frac{1}{16} \end{vmatrix} \tag{2}$$

is used to perform noise reduction without blurring the signals of interest. The filtered spectrogram must be then be binarized for Hough transform processing, but typical binarization techniques like thresholding have no way of distinguishing between signal and noise and will fail under non-white noise. Edge detectors can also be used, but they perform poorly in the high noise environments that are often encountered by remote sensors. Other noise filters can be used; however, many of these can be computationally intensive or have unacceptable results on real sensor data.

The approach chosen for binarization is non-maximum suppression (NMS). The user chooses a window size based on the number of pixels to be retained. This window size is used to break the spectrogram into non-overlapping windows. A "1" is placed where the maximum of each window occurs. All other pixels in each window become 0. NMS, in effect, retains the location of local maxima. More pixels can be retained by decreasing the NMS window size and fewer pixels can be retained by enlarging the NMS window size. For detecting vertical lines, a window that has a narrow height and large width is used. For detecting horizontal lines, a window with a large height and narrow width is used. If the lines in the spectrogram can be in any orientation, two NMS passes are required: one to detect vertical lines and one to detect horizontal lines. The two binary results are then logically combined with an OR function. For many applications, the signals of interest are mainly CW tones and LFM signals, which, for low Doppler shifts, are nearly vertical lines. Thus, in one test an NMS window size of 1×31 was used.

FIGS. 4A and 4B illustrate an example of NMS for a 1×5 window size on an 8×10 spectrogram. A typical window is shown at 54A. FIG. 4A shows an underlined pixel value for the maximum of each NMS window. One such value is identified at 56A in FIG. 4A. In FIG. 4B, the maximum in each window is set to 1 and every other cell in the window is set 0. One converted maximum is identified at 56B. After conversion, typical window 54A becomes window 54B.

NMS binarization has the expected behavior of only selecting the maximum frequency in each window, which means that lines near high-power lines will be suppressed. To prevent this suppression, a first NMS pass 58 was used and a second NMS pass 60 was used. The result of the first NMS pass 58 was processed with the morphological dilation operator 62 with a 5×5 structuring element. The output of the morphological dilation operator 62 is inverted by inverter 64. A multiplier 66 is used to multiply the filtered spectrogram from 52 by the inverse of the dilated NMS result to give a first pass NMS result. A second NMS pass is performed at 60 on the first pass NMS result, again with a 1×31 window. The results of the two NMS passes 58 and 60 are OR'd together. These operations may be expressed as:

$$NMS_2 = NMS(S \cdot ![NMS_1 \oplus B]) \quad (3)$$

where $NMS_2$ is the result of the second NMS pass, S is the spectrogram, $NMS_2$ is the result of the first NMS pass, $\oplus$ is the dilation operator, and B is the 5×5 structuring element. Other window sizes can be used for binarization. The window size of 1×31 is representative example of an application where vertical lines are desired. Additional NMS iterations can be used to extract even lower power lines.

Once the image has been binarized, the Hough transform can be performed. In a Hough transform, a set of hypothesis lines are proposed for each pixel at different angles θ. (Slopes could also be used.) A perpendicular is constructed from an origin to each hypothesis line. The length of the perpendicular from the origin to the hypothesis line is used to obtain a radius ρ. The angles θ and radii ρ of the hypothesis lines give coordinates in Hough space. Hough peaks are tabulated from the number of Hough space points sharing (ρ, θ) coordinates within a tolerance. The Hough peaks represent likely collinear points having coordinates (ρ, θ) in Hough space. Hough peak strength is given by the tabulated number of points sharing (ρ, θ) coordinates within the tolerance.

A restricted Hough transform is utilized in step 68 to reduce the computational cost. The restriction limits the angular disposition of the hypothesis lines. This limits the angle θ that the Hough transform searches over. The maximum frequency excursion, max ($f_{exc}$), of the signals of interest over the timespan of the spectrogram window, $T_{spec}$, can be calculated. The maximum frequency excursion and the timespan of the spectrogram can be used to calculate the maximum θ as $$\theta = \tan^{-1}\left(\frac{\max(f_{exc})}{T_{spec}}\right) \quad (4)$$

where max ($f_{exc}$) and $T_{spec}$ are in pixels. Using the maximum θ, the Hough transform does not have to search for lines that are not of interest. This will reduce the required processing. For example, if CW tones are of interest and the maximum Doppler shift is 10 Hz over 60 s, and the spectrogram frequency resolution is 1 Hz and time resolution is 1 s, then the maximum line angle is $$\theta = \tan^{-1}\left(\frac{\frac{10 \text{ Hz}}{1 \text{ Hz/Bin}}}{\frac{60 \text{ s}}{1 \text{ s/bin}}}\right) = \tan^{-1}\left(\frac{10}{60}\right) \approx 9.5° \quad (5)$$

The θ resolution of 0.5° provides good results.

In step 70, the peaks of the Hough transform are then extracted. The number of peaks returned determines how many detected lines will be returned. The number of peaks can be preselected based on processing capabilities. To this end, the number of peaks should be set high enough that sufficient lines are created to characterize the signal without causing extraneous processing. To end up with, say, 50 unique lines, around 400 peaks from the Hough transform may be needed. The selected peaks are the strongest lines detected in the NMS binarized image as measured by Hough peak strength which is the number of pixels on a line.

In step 72 lines are produced from peaks given by the restricted Hough transform of step 70. The peaks from the Hough transform are in (ρ, θ) space and must be converted back to Cartesian coordinates that correspond to start and end times and frequencies. This is performed for each Hough peak by taking the earliest time and associated frequency, and the latest time and associated frequency. This yields the end points corresponding to the detected line: ($t_1$, $f_1$) and ($t_2$, $f_2$). Step 74 combines these lines into unique lines because it is possible that the Hough transform can detect a single line as a set of disjoint lines, a set of overlapping lines, or a set of closely spaced adjacent lines. To make sure the lines are unique, lines that are closer than a user-defined threshold (e.g., 0.25 Hz) are collapsed into a single line. The number of pixels on the combined line can be provided as the Hough peak strength for the combined line. Other algorithms can be used for combining these lines.

The center frequency of the single line representing multiple collapsed lines is calculated as $$f_{center} = \frac{1}{N}\sum_n f_{n,1} + w_n \cdot \left(\frac{f_{n,2} - f_{n,1}}{2}\right) \quad (6)$$

where n is the index of the line being collapsed, N is the total number of lines being collapsed, and $w_n$ is a normalized weight based on the length of the line, or $$w_n = \frac{\sqrt{(t_{n,1} - t_{n,2})^2 + (f_{n,1} - f_{n,2})^2}}{\sum_n w} \quad (7)$$

In step 76, the number of lines to retain for transmission can be limited to a predetermined number based on the bandwidth of the transmission link. For example, the 50 lines with the highest line strength (as given by the tabulation of the Hough transform peaks or combined line strength) can be retained. If fewer than 50 lines have been detected, then they will all be retained. A different selection algorithm to determine which lines should be retained for transmission may be used other than the strongest lines. For example, the lines with the largest power could be retained or the lines below a certain frequency could be retained.

In step 78, line angle start and end frequencies can be calculated. Since the assumption is that all lines extend over the entire spectrogram timespan (and thus each line does not require time information), the angle or slope of each line must be calculated based on its start and end times/frequencies. (This calculation is performed because the angle from the Hough space peak has limited resolution.) The line angle is given by the inverse tangent of the slope:

$$\varphi_{line} = \tan^{-1}\left(\frac{f_2 - f_1}{t_2 - t_1}\right). \tag{8}$$

this means that where $\varphi_{line}=0°$ the line is vertical. Negative values for $\varphi_{line}$ indicate an upchirp (frequency increasing with time), and positive values for $\varphi_{line}$ denote a downchirp (frequency decreasing with time). From the center frequency, the line angle, and the timespan of the spectrogram, the frequency at the start of the spectrogram and the frequency at the end of the spectrogram can be extrapolated using $$f_{start} = f_{center} - \tan(\varphi_{line}) \cdot \frac{T_{spec}}{2} \tag{9}$$

$$f_{end} = f_{center} + \tan(\varphi_{line}) \cdot \frac{T_{spec}}{2}. \tag{10}$$

Of course, the slope calculated above in (8) could be used to calculate $f_{start}$ and $f_{end}$.

Now that the lines have been detected in the spectrogram, the salient parameters of the lines can be extracted. Parameter extraction routines are grouped together in block 80. For each line, a block of the spectrogram from $f_{start}$ to $f_{end}$ is used and the maximum frequency of each time slice is found. The average of these maxima gives a power estimate of the line in step 82. In step 84, the standard deviation of the maxima is used as a power stability parameter. A large standard deviation indicates the line is very unstable, while a smaller value indicates a more stable line.

Step 86 provides for calculation of a width parameter. The width of each line in frequency is determined using the −3 dB points on either side of the maximum in each time slice. That is, the points corresponding to half the power of the maximum on either side of the maximum are found. The average of the −3 dB widths from all the time slices give an estimate of the frequency width of the line.

Step 88 calculates a frequency wander parameter. A binary template of the line is created based on the previously calculated line angle. For each time slice, the location of the actual maximum is compared to the where the maximum should be based on the estimated line angle. Since this parameter only concerns variation and not direction, the absolute value of the variation from each time slice is averaged. This parameter measures the extent to which the frequency varies with respect to an idealized line.

After preparation of the signal parameters, the lines and parameters are prepared for transmission in step 90 by optimizing the information transmitted. The start frequency is quantized based on the sample rate and desired resolution. Instead of also transmitting the end frequency, the frequency excursion from the start frequency is transmitted, which in most cases is smaller than the range of the end frequency and thus can be represented with fewer bits. For example, for a sample rate of 1 kHz and a desired resolution of ~0.03 Hz, 13-bits are used. In this example, the frequency excursion of 10 Hz over the spectrogram timespan of 60 s and a resolution of ~0.03 Hz uses 9-bits including a sign bit.

The frequency start and frequency excursion values may be scaled by the maximum if they are not the same as the range given by the required number of bits. By scaling down by the maximum before transmission and scaling back up upon reception, it is possible to add extra precision by making sure the full range is utilized.

The rest of the parameters are quantized to a number of levels by sorting the parameters and assigning (as closely as possible) the same number of values to each level. Each parameter is quantized to a preselected number of levels. In one embodiment the parameters were quantized in a linear manner; however, for some parameters it may be desirable to have a non-linear relationship between the parameter values and the levels in order to differentiate a certain region of closely spaced values. This means the values will be relative with respect to the others in this spectrogram. For example, 2-bits may be used to represent the calculated power stability. If the power stability values for 8 lines are 10, 16, 17, 2, 4, 20, 6, and 15 then the four assigned levels will be 1, 2, 3, 0, 0, 3, 1, and 2 respectively.

The number of bits to use for the frequency width and frequency wander was also 2-bits, and 4-bits were used to represent the power. In the exemplary embodiment, the total number of bits required for each line are as follows:

| Parameters | Bits |
|---|---|
| Frequency start | 13 |
| Frequency excursion | 9 |
| Line width level | 2 |
| Line wander level | 2 |
| Power level | 4 |
| Power stability level | 2 |
| Total | 32 |

Utilizing the Iridium Short Data Burst (SBD) format, which allows 300-bytes, and assuming 100-bytes for sensor ID, timestamp, location, sensor health, etc. that leaves 200-bytes to transmit spectrogram data. In this model, it is possible to send 50 lines with the above described method which has been shown to be sufficient to accurately represent a busy spectrogram. If the spectrogram is 60 s×1000 Hz with is time resolution and 0.25 Hz frequency resolution and 4 bits are used to represent the power of each sample, this represents a compression ratio of $$\text{compression ratio} = \frac{(60 \cdot 4000 \cdot 4)/8}{200} = 600. \tag{11}$$

After creating the binary message, the remote sensor module is ready to transmit the message. This message can be received at a site by a receiving module. The received data can be used to feed signal detectors or to generate an approximation of the spectrogram for a human analyst. The frequency start and excursion is used to indicate where a line should be drawn and the width of the lines can be adjusted based on the line width level. The power level can be used to vary the intensity or color in the display. The power stability level may be represented by dashed lines with increasing dashes for increasing instability. The line wander level may be denoted with a marker where the number of markers indicates the level of wander. When the next message is received, the regenerated spectrogram can be stacked upon the previous regenerated spectrogram to build up a continuous display in time.

Figure 5A:
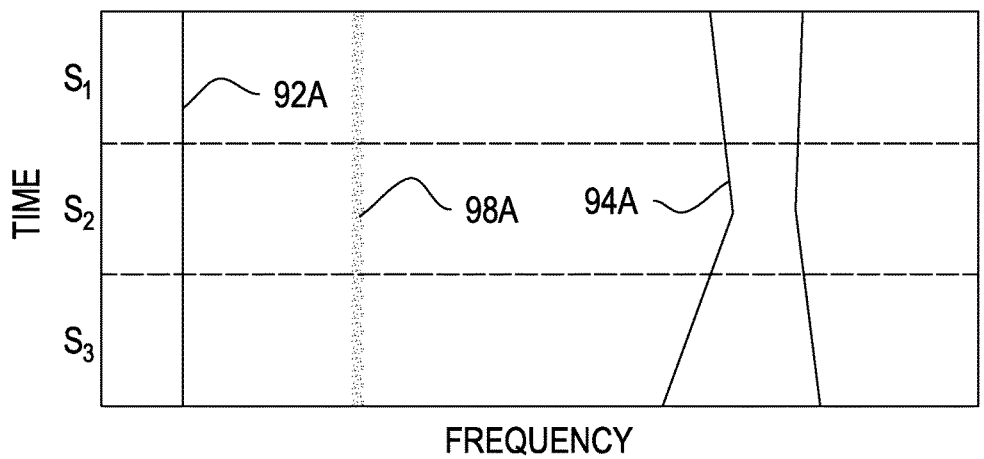
FIG. 5A is a diagram of a sample spectrum.
Figure 5B:
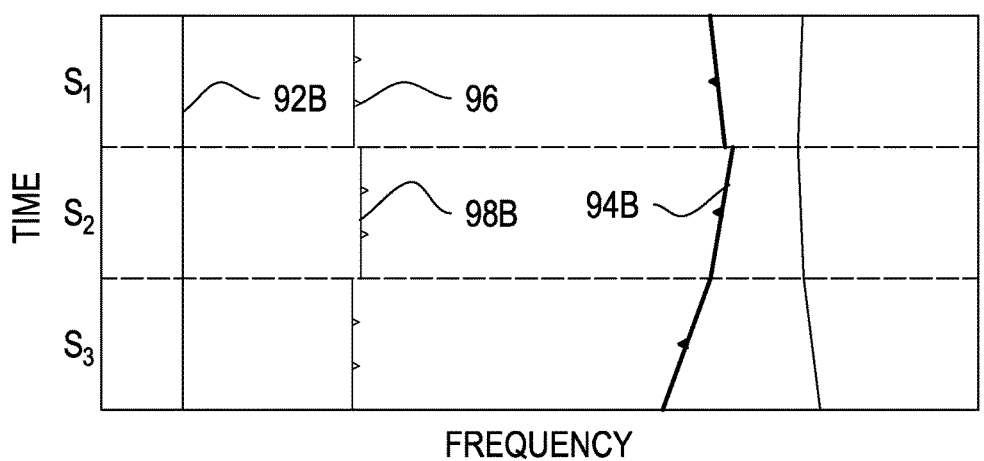
FIG. 5B shows the spectrum of FIG. 5A after conversion into lines, transmission and decoding.

FIG. 5A shows an example original spectrogram, and FIG. 5B shows a regenerated spectrogram from the transmitted line parameters. $S_1$, $S_2$, and $S_3$ denote three distinct spectrograms (separated by the horizontal dashed lines) that are stacked together upon reception. CW tones such as 92A are captured as straight lines such as at 92B. Lines having frequencies that change during the spectrogram period, such as that at 94A, are only approximated as at 94B. These approximations can be mitigated in this case by halving the spectrogram time span or mitigated in general by utilizing knowledge of the signals of interest.

The regenerated spectrogram can also have markers illustrating other parameters. In FIG. 5B, triangular markers 96 denote the line wander, which is highest for signal 98A which is reproduced as line 98B. Signal 98A is actually an FM modulated tone. Power can be captured with the darkness or thickness of the lines.

The general method herein described is to intelligently binarize a spectrogram collected from a measured environmental signal, perform a restricted Hough transform to transform the spectrogram into lines, extract interesting parameters from each line, quantize the data, and transmit. Specific parameters such as center frequency, frequency excursion, power, temporal stability, line width, and line wander can be characterized.

This method gives very large compression ratios by leveraging general information about the signals of interest (e.g., maximum frequency excursion, stability). It is also conceptually simple with minimal computational complexity. This is especially effective for sensors that are mainly tailored for detection of CW tones or LFM. The large compression allows minimal transmission time when compared with sending raw time series or spectrogram data allowing use of extremely short messages. Additionally, by capturing the lines in the spectrogram, which correspond to the desired signals, there is a smaller chance of losing important data than when compressing the data without any knowledge of the signal.

The method given herein can be practiced otherwise than specifically described. Other parameters of interest besides those described may be estimated and transmitted to characterize the detected lines. The parameters may be quantized to an absolute, instead of relative, scale as well. This would require the sensor to know the values with which to threshold a priori. Many different digital transmission techniques can be used.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A method for signal compression comprising the steps of:
    receiving analog data from a sensor in a remote sensor module;
    converting received analog data into digital time series data for a time segment;
    transforming said digital time series data into a spectrogram covering the time segment;
    filtering noise from said spectrogram to produce a filtered spectrogram;
    converting said filtered spectrogram into a binary spectrogram representation;
    performing a Hough transform on the binary spectrogram representation to produce Hough peaks;
    selecting a predetermined number of Hough peaks in response to preselected Hough peak criteria;
    creating lines in time frequency space from said selected predetermined number of Hough peaks and said filtered spectrogram;
    combining multiple created lines into fewer combined lines when the created lines meet predetermined line combination criteria;
    determining a number of lines for transmission in accordance with a predetermined transmission bandwidth;
    limiting the number of the combined lines for transmission to the combined lines meeting a transmission bandwidth criteria;
    composing a binary message by optimizing the time and frequency values for the limited number of combined lines;
    transmitting the composed binary message by the remote sensor module;
    receiving the composed binary message at a receiving module;
    creating a reconstructed spectrogram from the composed binary message; and
    providing a display related to the reconstructed spectrogram.

2. The method of claim 1 wherein said step of converting said filtered spectrogram comprises performing at least one stage of non-maximum suppression on said filtered spectrogram.

3. The method of claim 1 wherein said step of utilizing a Hough transform comprises utilizing a Hough transform restricted to be less than a predetermined maximum frequency excursion.

4. The method of claim 1 wherein said step of combining combines lines that are within a predetermined frequency threshold.

5. The method of claim 1 further comprising the step of extending the combined line to the beginning and end of the time segment and utilizing the extended line as the combined line.

6. The method of claim 5 wherein said step of extending comprises the steps of:
    computing a center frequency for the combined line;
    computing a slope for the combined line; and
    computing a frequency start value and a frequency end value from the center frequency and the slope.

7. The method of claim 6 wherein the center frequency is computed as an average of all of the frequencies of the combined lines weighted by the length of line being combined.

8. The method of claim 1 further comprising the steps of:
    computing parameters for each combined line from the spectrogram; and
    adding said computed parameters to said composed binary message.

9. The method of claim 8 wherein said step of computing parameters comprises computing at least one of power, stability, width, and wander.

10. The method of claim 1 further comprising the step of displaying the reconstructed spectrogram.

11. The method of claim 10 further comprising the steps of:
computing parameters for each combined line from the spectrogram;
adding at least one computed parameter to said composed binary message;
retrieving said computed parameters from said composed binary message; and
enhancing the displayed reconstructed spectrogram by displaying a visual indicia indicating at least one computed parameter.

12. A method for data compression comprising the steps of:
deploying a remote sensor module having a sensor, an analog to digital convertor, a discrete Fourier transformer, a processor, and a transmitter;
receiving analog data at the analog to digital convertor from the sensor in the remote sensor module;
converting received analog data into digital time series data for a time segment utilizing the analog to digital convertor;
transforming said digital time series data in the discrete Fourier transformer into a spectrogram covering the time segment;
filtering noise from said spectrogram to produce a filtered spectrogram in the processor;
converting said filtered spectrogram into a binary spectrogram representation in the processor;
performing a Hough transform on the binary spectrogram representation to produce Hough peaks in the processor;
selecting a predetermined number of Hough peaks in response to preselected Hough peak criteria in the processor;
creating lines in time frequency space from said selected predetermined number of Hough peaks and said filtered spectrogram in the processor;
combining multiple created lines into fewer combined lines when the created lines meet predetermined line combination criteria in the processor;
determining a number of lines for transmission in accordance with a predetermined transmission bandwidth utilizing the processor;
limiting the number of the combined lines for transmission to the combined lines meeting a transmission bandwidth criteria by utilizing the processor;
composing a binary message by optimizing the time and frequency values for the limited number of combined lines by operation of the processor;
transmitting the composed binary message from the transmitter in the remote sensor module;
providing a receiving module having a receiver, a receive processor, and a display;
receiving the composed binary message at the receiver in the receiving module;
creating a reconstructed spectrogram from the composed binary message utilizing the receive processor;
extracting parameters from the reconstructed spectrogram utilizing the receive processor; and
displaying extracted parameters related to the reconstructed spectrogram at the display.

\* \* \* \* \*